(12) United States Patent
Hwang et al.

(10) Patent No.: US 6,821,907 B2
(45) Date of Patent: Nov. 23, 2004

(54) ETCHING METHODS FOR A MAGNETIC MEMORY CELL STACK

(76) Inventors: Jeng H. Hwang, 20835 Scofiled Dr., Cupertino, CA (US) 95014; Guangxiang Jin, 1738 Fumia Dr., San Jose, CA (US) 95131; Xiaoyi Chen, 811 Volans La., Foster City, CA (US) 94404

( * ) Notice: Subject to any disclaimer, the term of this patent is extended or adjusted under 35 U.S.C. 154(b) by 7 days.

(21) Appl. No.: 10/092,456

(22) Filed: Mar. 6, 2002

(65) Prior Publication Data

US 2003/0170985 A1 Sep. 11, 2003

(51) Int. Cl.$^7$ ............................................. H01L 21/461

(52) U.S. Cl. ...................... 438/709; 438/710; 438/712

(58) Field of Search ................................ 438/710–712, 438/720, 637–638, 3, 700; 216/22

(56) References Cited

U.S. PATENT DOCUMENTS

| | | | | |
|---|---|---|---|---|
| 4,439,294 A | * | 3/1984 | Bril et al. | 204/192.35 |
| 5,496,759 A | | 3/1996 | Yue et al. | 437/52 |
| 5,607,599 A | | 3/1997 | Ichihara et al. | 216/22 |
| 5,732,016 A | | 3/1998 | Chen et al. | 365/158 |
| 5,920,500 A | | 7/1999 | Tehrani et al. | 365/173 |
| 5,940,319 A | | 8/1999 | Durlam et al. | 365/171 |
| 6,024,885 A | | 2/2000 | Pendharkar et al. | 216/22 |
| 6,048,739 A | | 4/2000 | Hurst et al. | 438/3 |
| 6,069,035 A | * | 5/2000 | O'Donnell et al. | 438/220 |
| 6,153,443 A | | 11/2000 | Durlam et al. | 438/3 |
| 6,165,803 A | | 12/2000 | Chen et al. | 438/3 |
| 6,174,737 B1 | | 1/2001 | Durlam et al. | 438/3 |
| 6,365,419 B1 | | 4/2002 | Durlam et al. | 438/3 |
| 6,491,832 B2 | * | 12/2002 | Yoshioka et al. | 216/22 |

OTHER PUBLICATIONS

Jung, K.B., et al., "Long term stability of dry etched magnetoresistive random access memory elements", *Journal of Vacuum Science and Technology:Part A*; American Institute of Physics, New York, U.S., vol. 18, No. 1, Jan. 2000, pp. 268–272, XP001145970, ISSN: 0734–2101.

Van Delft, F.C.M.J.M., et al., "The etch mechanisms of magnetic materials in an HCl plasma", Fusion Technology and Plasmas Session of the Twelth International Vacuum Congress (IVC–12) and Eighth International Conference on Solid Surfaces (ICSS–8), The Hague, Netherlands, Oct. 12–16, 1992, vol. 200, No. 3, pp. 366–370, XP008022404, *Journal of Nuclear Materials*, May 1993, Netherlands, ISSN: 0022–3115.

Cho, H. et al., "Inductively coupled plasma etching of CoFeB, CoZr, CoSm and FeMn thin films in interhalogen mixtures", *Materials Science and Engineering B (Solid-State Materials for Advanced Technology)*, Jun. 15, 1999, Elsevier, Switzerland, vol. B60, No. 2, pp. 107–111, XP004175032, ISSN: 0921–5107.

\* cited by examiner

*Primary Examiner*—Dung A. Le
(74) *Attorney, Agent, or Firm*—Moser, Patterson & Sheridan, L.L.P.; Joseph Bach

(57) ABSTRACT

A method and apparatus for etching a magnetic memory cell stack are described. More particularly, HCl is used as a main etchant gas for etching a magnetic memory cell stack. HCl is used in part to reduce corrosion and improve selectivity. Additionally, use of an amorphous carbon or hydrocarbon based polymer resin for a hard mask is described, as well as a post-etch passivation with a water rinse, a water vapor plasma treatment or an ammonia plasma treatment. Moreover, in an embodiment, a diffusion barrier layer dispose most of the magnetic memory cell stack is etched with hydrogen and fluorine containing gas in a separate process chambers.

27 Claims, 5 Drawing Sheets

ETCHING METHODS FOR A MAGNETIC MEMORY CELL STACK

BACKGROUND OF THE INVENTION

1. Field of the Invention

The present invention generally relates to methods for etching a magnetic memory cell stack, and more particularly to methods for etching a magnetic tunnel junction (MTJ) magnetic random access memory (MRAM) cell stack.

2. Description of the Related Art

The push to continually increase memory bit densities has lead to memory structures to replace conventional memory cells having sub-micron feature size. Advances in giant magnetoresistance (GMR) and colossal magnetoresistance (CMR) materials have lead to potential substitutes for conventional memory cells, including, but not limited to, substitutes for static random access memory (SRAM) cells, dynamic random access memory (DRAM) cells, and flash memory cells, among others. Moreover, owing to a non-volatile aspect of magnetic memory, it is a potential substitute for read only memory (ROM) technologies too.

GMR material is formed as material layers to provide a memory cell stack. However, GMR memories tend to have resistance limitations creating sensing inefficiency. To address these limitations, a magnetic tunnel junction (MTJ) stack has been proposed. In an MTJ stack, a tunnel barrier layer separates two magnetically oriented material layers.

Forming such magnetic memory cell stacks is problematic owing to non-volatility of materials used, therefore, ion milling has been used to form magnetic memory cell stacks. However, ion milling is not material selective, making stopping at a correct depth problematic, and etch rates for ion milling processes are too slow to be commercially practical. Moreover, temperatures associated with ion bombardment negatively affects magnetic properties of magnetic materials. Accordingly, plasma or dry etching using predominantly chemically active etchants is desirable for etching magnetic materials owing to etch rate and selectivity, as well as lower temperature as compared with ion milling.

Etchants used to etch such magnetic memory cell stacks are quite aggressive, and thus etching by-products of such etchants tend to be corrosive. Moreover, Pt, Mn, Ni, Fe, and Co among other materials used in magnetic memory cell stacks tend to etch slower than photoresist is consumed. In other words, resist thickness is increased to etch through a magnetic memory cell stack, which in turn increases aspect ratio. An increase in aspect ratio can preclude dense spacing of magnetic memory cell stacks due to difficulty in evacuating by-products. Furthermore, etching of such stacks in densely spaced areas may be prematurely halted if aspect ratio is too high.

In an article entitled "Relative merits of $Cl_2$ and $CO/NH_3$ plasma chemistries for dry etching magnetic random access memory device elements" by K. B. Jung et al. in Volume 85, Number 8, of the Apr. 15, 1999, issue of the Journal of Applied Physics at pages 4788 to 4790, high ion density plasma reactors, such as electron cyclotron resonance (ECR) and inductively coupled plasma (ICP) reactors, were discussed for etching magnetic multilayers. More particularly, an ICP source was used to etch magnetic multilayers using a $Cl_2$ with Ar, $N_2$, $H_2$ and $CO/NH_3$ chemistries. A mentioned drawback of this chemistry was corrosion of magnetic materials from chlorine residue, though it is alleged that a small but measurable enhancement resulted from the $CO/NH_3$ plasma. However, with $CO/NH_3$, etch rates of photoresist were a factor of ten higher, requiring use of a hard mask, such as an $SiO_2$ mask. In an article entitled "Development of chemically assisted dry etching methods for magnetic device structures" by K. B. Jung et al. in Volume 17, Number 6, of the November/December 1999, issue of the Journal of Vacuum Science Technology at pages 3186 to 3189, post-etch rinsing in water or in situ cleaning with $H_2$, $O_2$ or $SF_6$ plasma discharges were suggested as solutions for removing post-etch chlorine residues from a $Cl_2/Ar$ etch chemistry. Where exposure to the $O_2$ plasma was alleged to be the only one to harm magnetic properties of MRAM stacks of the three suggested in situ cleaning plasmas.

Accordingly, it would be desirable and useful to provide method and apparatus to etch magnetic material stacks that at least reduces corrosion. Moreover, it would be more desirable and useful if such method and apparatus were more selective to mask resist.

SUMMARY OF THE INVENTION

An aspect of the present invention is a method for forming a magnetic memory cell. A semiconductor wafer is loaded into an etch process chamber. The semiconductor wafer has at least one masking layer formed over a set of layers for forming the magnetic memory cell. The set of layers comprises a subset of layers including at least two magnetic layers separated by an electron barrier layer and including an anti-magnetic layer. Plasma etch is done through openings formed in the at least one masking layer. The plasma etching includes flowing at least one plasma source gas into the etch process chamber, where the at least one plasma source gas comprises HCl.

Another aspect of the present invention is a method for plasma etching in a plasma reactor to provide a magnetic memory cell stack. A work piece is positioned in the plasma reactor. The work piece comprises at least one magnetic material layer that is selected from NiFe, CoFe, NiFeCo, and Ru. A plasma source material is flowed into the plasma reactor chamber. The plasma source material comprises HCl from which a plasma from the plasma source material is generated. The work piece is exposed to the plasma to etch the at least one magnetic material layer.

Another aspect of the present invention is a method for plasma etching in a plasma reactor to provide a magnetic memory cell stack. A work piece is positioned in the plasma reactor. The work piece comprises an anti-magnetic material layer which is selected from IrMn and PtMn. A plasma source material is flowed into the plasma reactor chamber. The plasma source material comprises HCl from which a plasma from the plasma source material is generated. The work piece is exposed to the plasma to etch the anti-magnetic material layer.

Another aspect of the present invention is a method for forming a magnetic memory cell in two etch process chambers. More particularly, a semiconductor wafer is loaded into a first etch process chamber. The semiconductor wafer has at least one masking layer formed over a set of layers for forming the magnetic memory cell. The set of layers includes a subset of layers having at least two magnetic layers separated by an electron barrier layer and include an anti-magnetic layer. The subset of layers does not include a diffusion barrier layer, though a diffusion barrier layer can be located below the subset of layers. The subset of layers is plasma etched through openings formed in the at least one masking layer, where the plasma etching includes flowing a first plasma source gas comprising HCl into the first etch process chamber. The semiconductor wafer is then removed from the first etch process chamber and loaded into a second etch process chamber for plasma etching the diffusion barrier layer of the semiconductor wafer, where a second plasma source gas comprising $CHF_3$ is flowed into the second etch process chamber.

Another aspect of the present invention is for a process chamber configured to allow an operator thereof to select a gaseous mixture for etching a portion of a magnetic memory cell stack. The portion of the magnetic memory cell stack has two magnetic orientation material layers separated by a tunnel barrier layer and has an anti-magnetic material layer. The gaseous mixture comprises HCl as a main etchant gas to etch the portion of the magnetic memory cell stack.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1A:
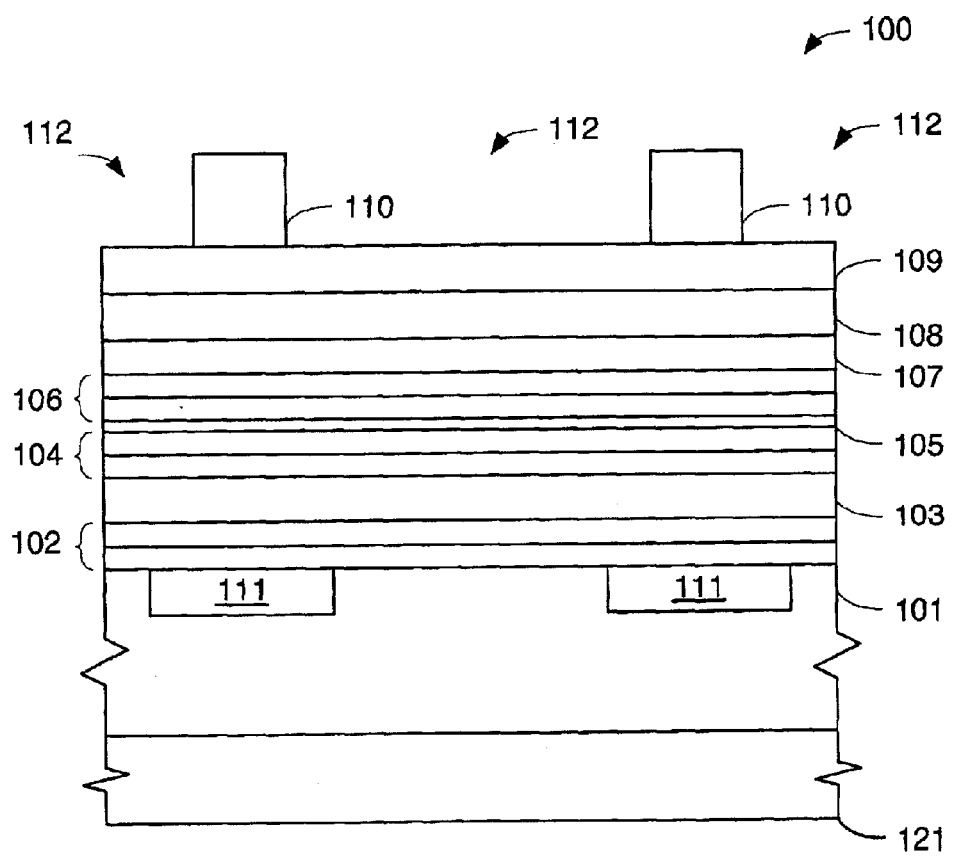
FIGS. 1A and 1B are cross-sectional diagrams of exemplary portions of alternative embodiments of inprocess wafers in accordance with one or more aspects of the present invention.

Referring to FIG. 1A, there is shown a cross-sectional diagram of an exemplary portion of an embodiment of an inprocess work piece, such as a semiconductor wafer, 100 in accordance with one or more aspects of the present invention. Though an MRAM cell film stack is shown as a portion of wafer 100, it should be appreciated that one or more aspects of the present invention may be used for magnetic multilayer stacks other than MRAM cell film stacks. For purposes of clarity, an MRAM cell film stack is describe as an MTJ stack, though other known MRAM cell film stacks may be used in accordance with one or more aspects of the present invention.

Figure 1B:
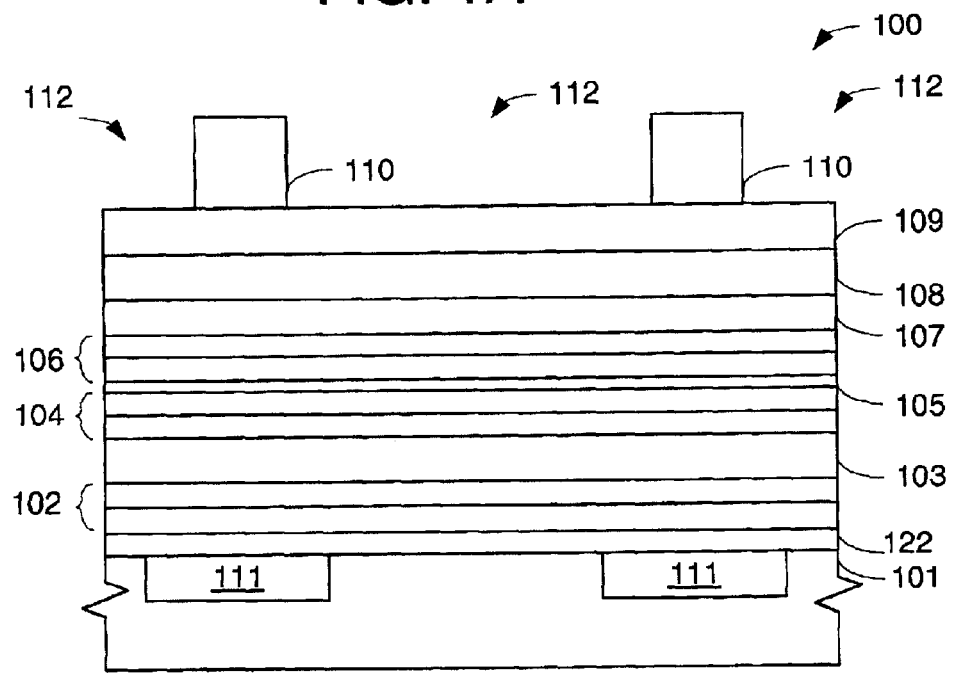

Wafer 100 comprises a substrate assembly 121 above which intermetal dielectric (IMD) layer 101 is formed having recessed metal or interconnect lines 111. Conventionally, IMD layer 101 is formed of a silicon nitride or silicon oxide. Conventionally, interconnect lines 111 are formed of copper or aluminum. Alternative conventional configurations include, but are not limited to, a portion of IMD layer 101, or one or more separate buffer layers 122 formed of a silicon nitride or silicon oxide, located between metal line 111 and diffusion barrier layer 102, as shown in FIG. 1B.

Over metal lines 111 is one or more bottom diffusion barrier layers 102. Conventionally, diffusion barrier layers 102 are formed of approximately 100 to 1000 Angstroms (Å) of tantalum or tantalum nitride. Over bottom diffusion barrier layers 102 is anti-magnetic layer 103. Conventionally, anti-magnetic layer 103 is formed of approximately 50 to 300 Å of PtMn or IrMn. Over anti-magnetic layer 103 is one or more magnetically oriented layers 104. Conventionally, magnetically oriented layers 104 are formed of approximately 10 to 60 Å of NiFe, CoFe, NiFeCo, or Ru.

Over magnetically oriented layers 104 is tunnel barrier layer 105. Conventionally, tunnel barrier layer 105 is formed of approximately 10 to 20 Å of aluminum oxide. Over tunnel barrier layer 105 is one or more magnetically orientable layers called "free" layers 106. Conventionally, "free" layers 106 are formed of approximately 10 to 80 Å of NiFe, CoFe, and/or NiFeCo. Over free layers 106 is top diffusion barrier layer 107. Conventionally, top diffusion barrier layer 107 is formed of approximately 50 to 500 Å of tantalum or tantalum nitride.

Over top diffusion barrier layer 107 is an optional hard mask layer 108. Conventionally, hard mask layer 108 is formed of silicon nitride, silicon oxide, or titanium nitride. Over top diffusion barrier layer 107, and over hard mask layer 108, is antireflective coating (ARC) layer 109 and patterned resist layer 110. Patterned resist layer 110 defines openings 112.

Notably, a conventional MTJ stack is described. However, one or more other intervening layers or substitute layers with different materials may comprise an MTJ stack in accordance with one or more aspects of the present invention. For example, anti-magnetic layer 103 may be placed between top diffusion barrier layer 107 and magnetic layers 106. Accordingly, magnetic layers 104 become magnetically orientable, and magnetic layers 106 become magnetically oriented layers. In which embodiment, magnetically orientable layers 104 are positioned immediately above bottom diffusion barrier layer 102. This is known as an "inverted" MTJ stack. Moreover, a contact opening may be formed above metal lines 111, and one or more buffer layers 122 or a bottom diffusion barrier layer 102 may be formed in such a contact opening.

An aspect of the present invention is to use resist layer 110 for an etch designed to stop on tunnel barrier layer 105, and use a hard mask layer 108 to etch tunnel barrier layer 105 and layers therebelow of an MRAM cell film stack. Hard mask layer 108 is formed of an amorphous carbon or a high-temperature polymer. By high-temperature polymer, it is meant a polymer stable below and up to at least approximately 300 degrees Celsius. Examples of high-temperature polymers include, but are not limited to, SiLK from The Dow Chemical Company, and FLARE from AlliedSignal, Inc., among other spin-on, low-k dielectrics. Advantageously, amorphous carbon and high-temperature polymers may be used for temperatures associated with any plasma which can cause an MTJ stack to have a temperature greater than 150 degrees Celsius. Moreover, amorphous carbon and hydrocarbon-based polymers are more readily removed than silicon nitride and silicon oxide after etching. Silicon oxide and silicon nitride are conventionally removed using a wet etch HF based, $H_2PO_3$ based or $H_2SO_4$ based chemistry, which may damage an MRAM cell stack having a silicon oxide or a silicon nitride as one or more buffer layers 102. However, amorphous carbon and high-temperature polymers may be removed by ashing, such as with $O_2$ plasma, which will not be as aggressive on one or more silicon oxide or silicon nitride buffer layers 102 as an HF based chemistry. Notably, conventionally photoresist 110 is stable below approximately 150 degrees Celsius.

Figure 2A:
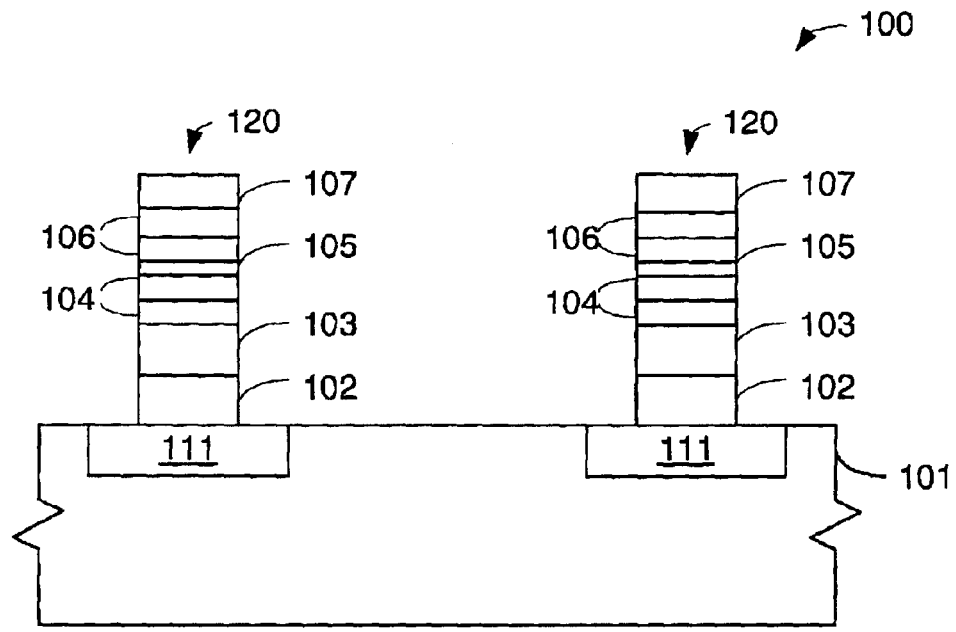
FIGS. 2A, 2B, 2C and 2D are cross-sectional diagrams of embodiments of the inprocess wafers after various stages of etching in accordance with one or more aspects of the present invention.

Referring to FIG. 2A, there is shown a cross-sectional diagram of an exemplary portion of in process wafer 100 after etching in accordance with one or more aspects of the present invention. Hard mask layer 108 (shown in FIG. 1), if used, has been removed. However, optionally hard mask layer 108 may be left to form part of a resulting structure. Notably, during etching of wafer 100, resist layer 110 and ARC layer 109 are consumed. However, these layers are not consumed until after etching past hard mask layer 108, which thus leaves a patterned portion of hard mask 108 in place for etching layers therebelow. Alternatively, hard mask layer 108 may be not be used, and a thicker or taller layer of resist layer 110 may be used, but this may be limited by lithographic depth of focus.

In contrast to the prior art use of a $Cl_2$ main etchant; an aspect of the present invention is use of HCl as a main etchant. HCl plasma comprise hydrogen and chlorine ions and radicals, which dissociation is different from that of $Cl_2$. While not wishing to be bound by theory, it is believed that hydrogen is a reduction agent that helps convert unused or excess chlorine, as well as chloride by-products, to HCl gas. This results in less corrosive by-products disposed on one or more surfaces of etched MTJ stacks, as compared with $Cl_2$ plasma, as HCl gas may be pumped out of a chamber. Moreover, MTJ stack to resist mask selectivity with HCl plasma is better than that of $Cl_2$ plasma, so a single-mask layer of photoresist is more feasible for etching an entire MTJ stack 120. HCl may be used with additive gases such as CO, $N_2$, or Ar to enhance MTJ stack to mask selectivity when mask material such as silicon oxide and the like is used. Notably, another hydrogen halide, such as HBr, may be used as an etchant gas in addition to HCl.

Figure 3:
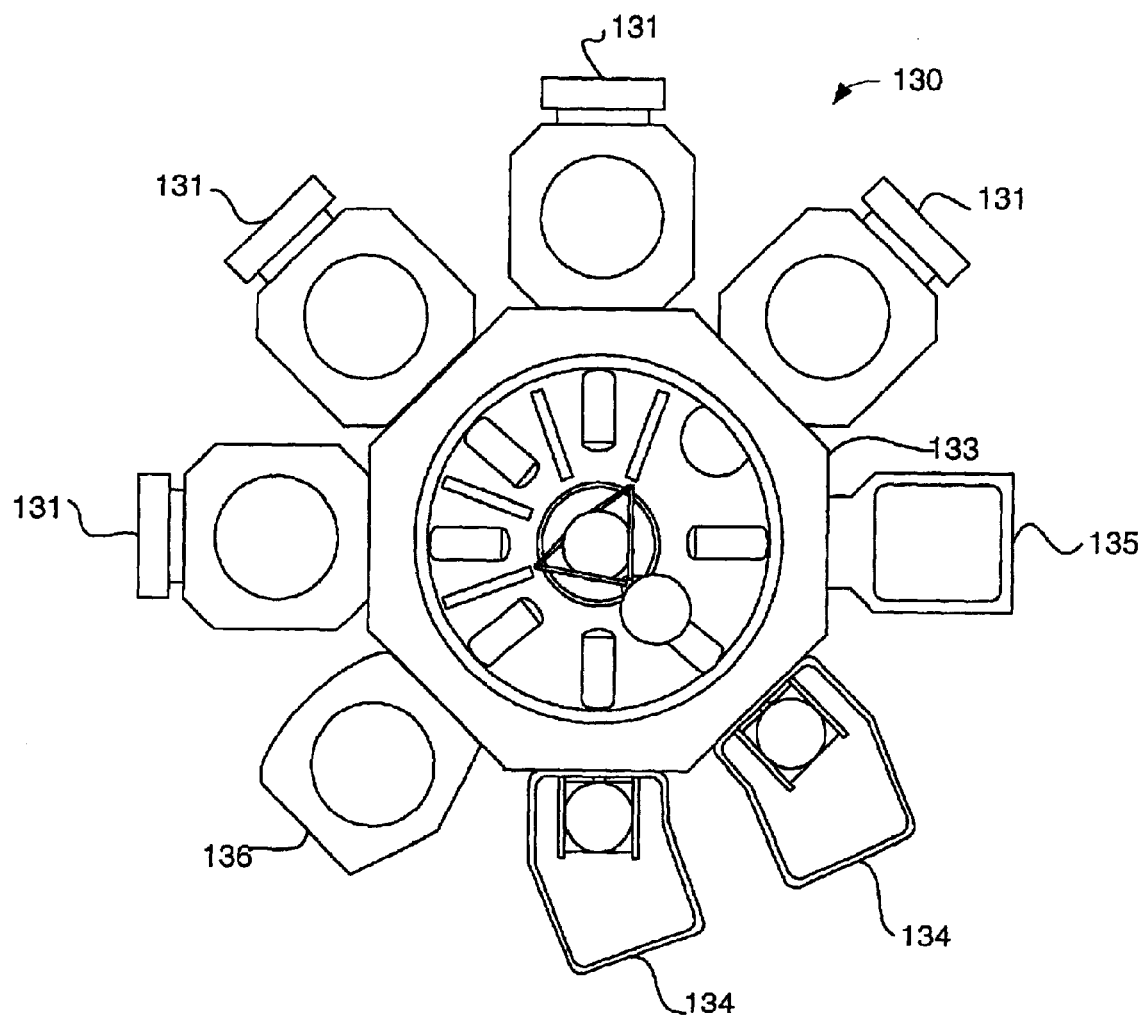
FIG. 3 is a top cut-away view of a plan diagram of an exemplary embodiment of an etch system of the prior art that may be used in accordance with one or more aspects of the present invention.

Referring to FIG. 3, there is shown a block diagram of an exemplary embodiment of a semiconductor wafer processing system 130 in accordance with one or more aspects of the present invention. Process chambers 131 and wafer load locks 134 are coupled to wafer handler 133. Additionally coupled to wafer handler 133 is water rinse station 135 and cool-down chamber 136. Process chambers 131 comprise plasma reactor chambers configured for plasma etching. Process chamber 131 may be a DPS™ configured chamber commercially available from Applied Materials of Santa Clara, Calif. However, any of a variety of known plasma etch chambers may be used, including, but not limited to, ECR, ICP, RIE, helical, triode, MERIE and the like. Moreover, though a wafer handler 133 is illustratively shown for clustering process chambers, wafer handler 133 may be omitted. Moreover, though a plurality of process chambers 131 are shown, not all such chambers need be employed to practice the present invention as is evident in view of this specification the present invention may be used for example in a single process chamber.

With continuing reference to FIG. 3 and renewed reference to FIGS. 1 and 2A, wafer 100 is placed in process chamber 131. Etchant and additive gases are provided to process chamber 131 to etch wafer 100. Table I provides a tabulated list of various materials that may be used to form embodiments of layers for wafer 100 of FIG. 2A. By etchant gas, inert gases, such as Ar and He among others, are excluded. HCl is the "main etchant gas." By "main etchant gas," it is meant that HCl is provided in at least equivalent flow rate, if not greater, as compared to any other etchant gas used for etching layers 103, 104, 105 and 106. Etchant and additive gases that may be used with HCl include, but are not limited to, $CF_4$, $CHF_3$, Ar, $Cl_2$, $BCl_3$, $N_2$, $O_2$, HBr, and $SF_6$ provided that the "main etchant gas" is HCl for layers 103, 104, 105 and 106. Use of such other gases with HCl will depend upon the material being etched. So, by way of example and not limitation, HCl may be combined with HBr, $Cl_2$, $BCl_3$, Ar, $N_2$ and $O_2$ to etch NiFe and $Al_2O_3$ which may be used to form layers 106 and 104, and layer 105, respectively, as indicated in Table I.

TABLE I

| Layer(s) Reference No. | Layer(s) Material |
|---|---|
| 107 | Ta, TaN |
| 106 | CoFe, NiFe, NiFeCo, Ru |
| 105 | $Al_2O_3$ |
| 104 | CoFe, NiFe, NiFeCo, Ru |
| 103 | IrMn, PtMn |
| 102 | TaN, Ta |

Figure 2B:
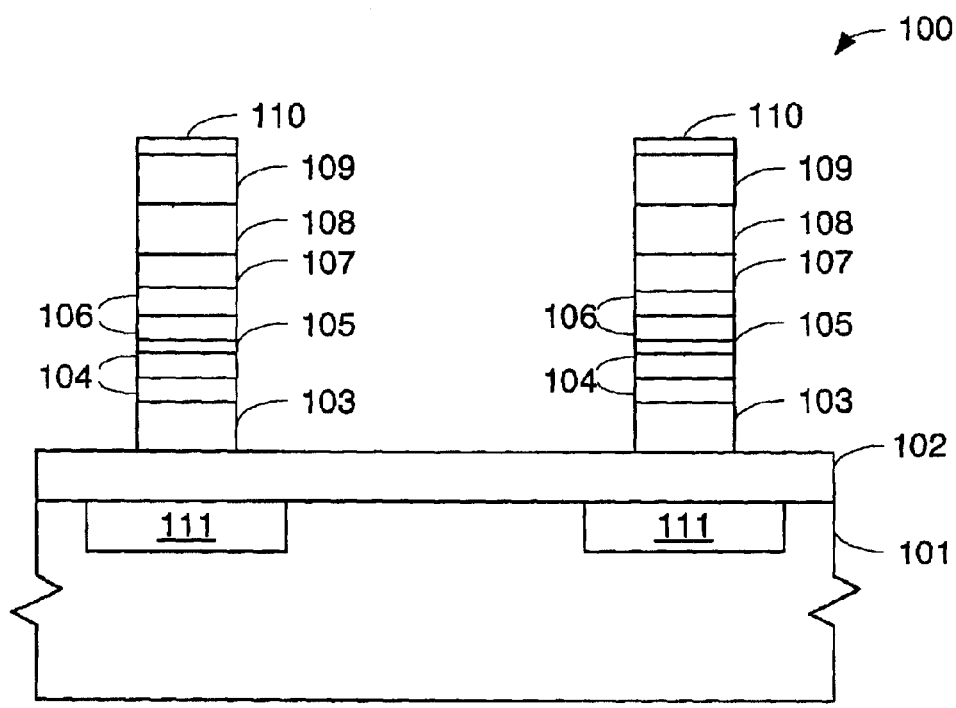
Figure 2C:
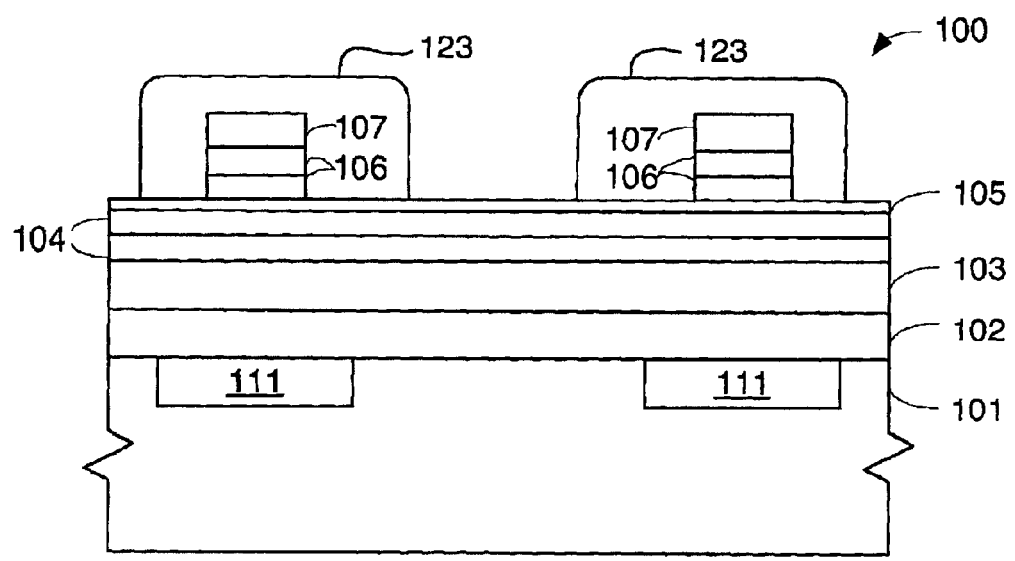
Figure 2D:
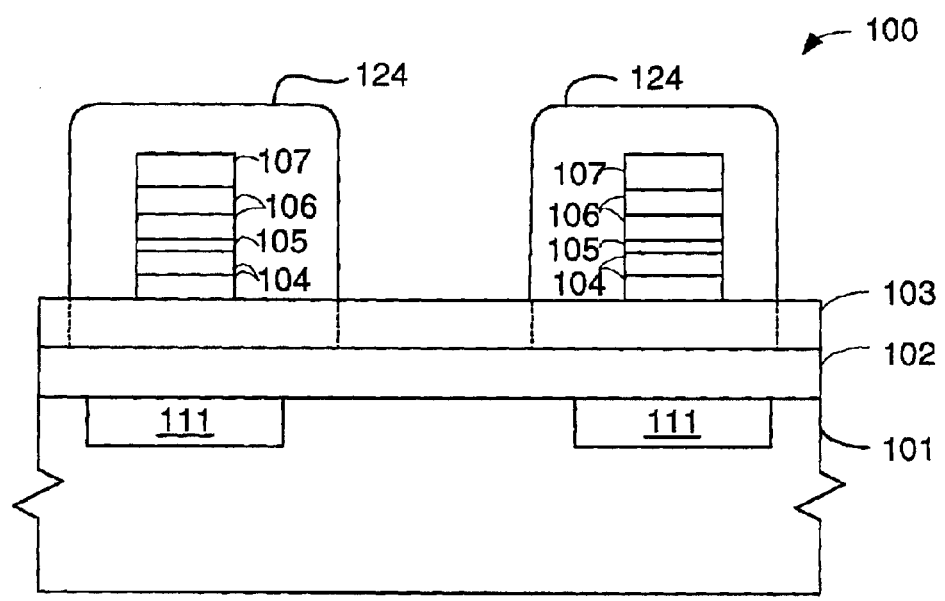

An aspect of the present invention is to etch down to layer 102 of wafer 100, and then move wafer 100 as shown in FIG. 2B, or FIGS. 2C and 2D, to another process chamber 131 for etching layer 102. This facilitates use of non-corrosive gases containing hydrogen and fluorine, such as $CHF_3$, $CH_2F_2$, and $CH_3F$, to etch layer 102. Alternatively, as shown in FIG. 2C, wafer 100 may be etched down to layer 105, after which mask layer 123 is deposited and patterned for etching remaining layers 105, 104, 103 and 102. Alternatively, as shown in FIG. 2D, wafer 100 may be etched down to layer 103, or layer 102 as indicated by dashed lines, after which mask layer 124 is deposited and patterned for etching layers 103 and 102, or layer 102, as applicable. The etches shown in FIGS. 2B, 2C and 2D may be used with or without a hard mask layer 108.

After etching all or a portion of memory cell stack 120, a post etch clean or passivation treatment may be desirable. Cleaning may desirably be done in another process chamber 131 other than a chamber 131 used to etch stack 120. Cleaning may be done, such as at rinse station 135, by DI water rinsing to remove chlorine or bromine etch residue remaining on one or more surfaces of one or more etched memory cell stacks 120.

Notably, chlorine and chloride couple with hydrogen, such as from water vapor plasma, to form HCl. Alternatively or in addition to water rinsing, water vapor plasma or ammonia plasma may be used for this plasma passivation treatment. In addition to passivation, an in situ plasma clean may be done with $H_2$, $O_2$, or $SF_6$, as is known, to remove chlorine etch residue.

Figure 4:
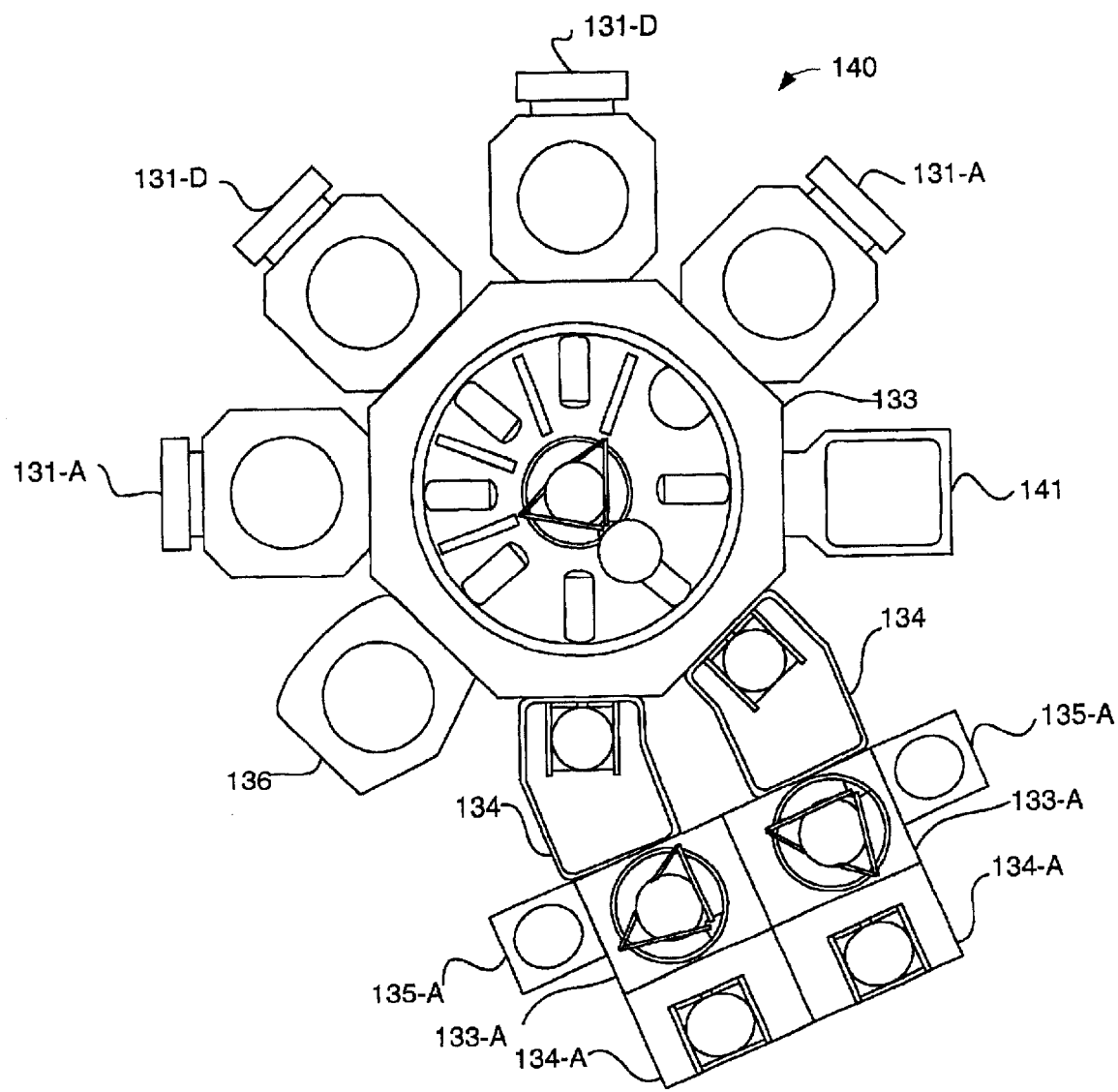
FIG. 4 is a block diagram of an exemplary embodiment of an alternate embodiment of a semiconductor wafer processing system in accordance with one or more aspects of the present invention.

Referring to FIG. 4, there is shown a block diagram of an exemplary embodiment of an alternate embodiment of a semiconductor wafer processing system 140 in accordance with one or more aspects of the present invention. Etch process chambers 131-D are DPS configured process chambers, and photoresist and passivation process chambers 131-A are ASP™ configured chambers commercially available from Applied Materials of Santa Clara, Calif. Additionally, rinse stations 135-A are shown exposed to a clean room atmosphere in contrast to rinse station 135 of FIG. 3, which is replaced in FIG. 4 with wafer orienter 141. Rinse stations 135-A are coupled to wafer handlers 133-A, which are exposed to a clean room atmosphere. Non-vacuum sealed wafer loading stations 134-A are coupled to wafer handlers 133-A.

As mentioned above, MTJ stack to mask selectivity is enhanced by use of HCl. Using conventional values for pressure, bias power, source power, and cathode temperature maintenance, an improvement in selectivity of at least 20% may be achieved.

All trademarks are the property of their respective owners.

While the foregoing is directed to embodiments of the present invention, other and further embodiments of the invention may be devised without departing from the basic scope thereof, and the scope thereof is determined by the claims that follow.

What is claimed is:

1. A method for plasma etching in a plasma reactor, comprising:
    positioning a work piece in the plasma reactor, the work piece including at least one magnetic material layer selected from NiFe, CoFe, NiFeCo, and Ru and an electron barrier material layer having aluminum oxide;
    flowing a plasma source material into the plasma reactor, the plasma source material including HCl;
    generating a plasma from the plasma source material; and
    exposing the work piece to the plasma to etch the at least one magnetic material layer.

2. The method of claim 1 wherein the step of exposing the work piece to the plasma is to etch the electron barrier material layer.

3. The method of claim 1, wherein the plasma source material further includes $N_2$, $O_2$ or any combination thereof.

4. A method for plasma etching in a plasma reactor, comprising:
    positioning a work piece in the plasma reactor, the work piece comprising: at least one magnetic material layer selected from NiFe, CoFe, NiFeCo, and Ru; and an anti-magnetic material layer selected from PtMn and IrMn;
    flowing a plasma source material into the plasma reactor, the plasma source material including HCl;
    generating a plasma from the plasma source material; and
    exposing the work piece to the plasma to etch the at least one magnetic material layer.

5. The method of claim 4 wherein the step of exposing the work piece to the plasma etches the anti-magnetic material layer.

6. A method for plasma etching in a plasma reactor, comprising:
    positioning a work piece in the plasma reactor, the work piece including at least one magnetic material layer selected from NiFe, CoFe, NiFeCo, and Ru and an anti-magnetic material layer;
    flowing a plasma source material into the plasma reactor, the plasma source material including HCl;
    generating a plasma from the plasma source material; and
    exposing the work piece to the plasma to etch the at least one magnetic material layer.

7. The method of claim 6, wherein the step of exposing the work piece comprises etching the anti-magnetic material layer.

8. A method for plasma etching in a plasma reactor, comprising:
    positioning a work piece in the plasma reactor, the work piece including anti-magnetic material layer selected from PtMn and IrMn;
    flowing a plasma source material into the plasma reactor, the plasma source material including HCl;
    generating a plasma from the plasma source material; and
    exposing the work piece to the plasma to etch the anti-magnetic material layer.

9. The method of claim 8 wherein the work piece comprises an electron barrier, material layer having aluminum oxide.

10. The method of claim 9 wherein the step of exposing the work piece to the plasma is to etch the electron barrier material layer.

11. The method of claim 8 wherein the work piece comprises at least one magnetic material layer selected from NiFe, CoFe, NiFeCo, and Ru.

12. The method of claim 11 wherein the step of exposing the work piece to the plasma etches the at least one magnetic material layer.

13. A method for processing a substrate in a plasma reactor, comprising:
    introducing a plasma source material including HCl into the plasma reactor;
    generating a plasma from the plasma source material; and
    exposing the substrate to the plasma to etch a set of layers formed on the substrate, the set of layers having an anti-magnetic material layer and at least two magnetic material layers separated by an electron barrier layer.

14. The method of claim 13, wherein introducing the plasma source material comprises flowing the HCl at a rate equal to or greater than any other etchant gases for etching the set of layers.

15. The method of claim 13, wherein the other etchant gases comprise at least one of HBr, $Cl_2$, $BCl_3$, Ar, $N_2$ or $O_2$.

16. The method of claim 13, wherein the set of layers comprises at least one of Ni, Fe, Co, Ru or any combination thereof.

17. The method of claim 13, wherein the set of layers comprises at least one of Pt, Ir, Mn or any combination thereof.

18. The method of claim 13, wherein the electron barrier material layer comprises aluminum oxide.

19. The method of claim 13, wherein the anti-magnetic material layer is made from PtMn or IrMn.

20. The method of claim 13, wherein the at least two magnetic material layers are made from NiFe, CoFe, NiFeCo, or Ru.

21. The method of claim 13, wherein exposing the substrate to the plasma to etch the set of layers comprises etching through openings defined in at least one masking layer formed over the set of layers.

22. The method of claim 21, wherein the at least one masking layer comprises a layer of a resist and a layer of an amorphous carbon is formed over the set of layers.

23. The method of claim 21, wherein the at least one masking layer comprises a layer of a resist and a layer of a hydro-carbon polymer resin is formed over the set of layers.

24. The method of claim 13, further comprising, after exposing the substrate to the plasma, exposing the substrate to a second plasma for from a second plasma source material including a hydrogen and fluorine gas.

25. The method of claim 24, wherein the substrate is exposed to the second plasma in a second plasma reactor.

26. The method of claim 24, wherein the hydrogen and fluorine gas is selected from CHF3, CH2F2, or CH3F.

27. The method of claim 13, wherein the anti-magnetic material layer is made from PtMn or IrMn and the at least two magnetic material layers are made from NiFe, CoFe, NiFeCo, or Ru.

* * * * *

UNITED STATES PATENT AND TRADEMARK OFFICE
CERTIFICATE OF CORRECTION

| | |
|---|---|
| PATENT NO. | : 6,821,907 B2 |
| APPLICATION NO. | : 10/092456 |
| DATED | : November 23, 2004 |
| INVENTOR(S) | : Jeng H. Hwang, Jin Guangxiang and Cheng Xiaoyi |

It is certified that error appears in the above-identified patent and that said Letters Patent is hereby corrected as shown below:

<u>Title Page</u>
Add Assignee: Item [73] Applied Materials, Inc., P.O. Box 450-A, Santa Clara, CA 95052

Signed and Sealed this

Fifth Day of December, 2006

JON W. DUDAS
*Director of the United States Patent and Trademark Office*